(12) United States Patent
Nagarkar et al.

(10) Patent No.: US 8,698,258 B2
(45) Date of Patent: Apr. 15, 2014

(54) 3D INTEGRATED ELECTRONIC DEVICE STRUCTURE INCLUDING INCREASED THERMAL DISSIPATION CAPABILITIES

(75) Inventors: Kaustubh Ravindra Nagarkar, Clifton Park, NY (US); Christopher Fred Keimel, Schnectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/249,492

(22) Filed: Sep. 30, 2011

(65) Prior Publication Data

US 2013/0082376 A1  Apr. 4, 2013

(51) Int. Cl.
*G01L 9/00* (2006.01)

(52) U.S. Cl.
USPC ............... 257/419; 257/E23.193; 257/414; 257/698; 257/704; 438/53; 361/760; 361/781

(58) Field of Classification Search
USPC ......... 257/E29.324, E21.613, 698, 678, 680, 257/686, 704, 710, 711, E23.193, E23.127, 257/E21.414, 419, 613; 438/48, 52, 64, 438/455, 53; 359/291, 292, 298; 361/760, 361/781, 783
See application file for complete search history.

(56) References Cited

U.S. PATENT DOCUMENTS

| | | | |
|---|---|---|---|
| 6,362,518 B1 * | 3/2002 | Yatsuda | 257/678 |
| 6,384,353 B1 * | 5/2002 | Huang et al. | 200/181 |
| 6,441,481 B1 * | 8/2002 | Karpman | 257/711 |
| 6,624,921 B1 * | 9/2003 | Glenn et al. | 359/291 |
| 6,846,725 B2 * | 1/2005 | Nagarajan et al. | 438/456 |
| 7,030,642 B2 * | 4/2006 | Butsch et al. | 324/750.09 |
| 7,045,440 B2 | 5/2006 | Huff et al. | |
| 7,204,737 B2 * | 4/2007 | Ding et al. | 445/24 |
| 7,262,509 B2 * | 8/2007 | Garcia | 257/778 |
| 7,312,505 B2 * | 12/2007 | Kipnis et al. | 257/415 |
| 7,324,350 B2 * | 1/2008 | Heck et al. | 361/760 |
| 7,491,567 B2 * | 2/2009 | DCamp et al. | 438/51 |
| 7,642,657 B2 * | 1/2010 | Suilleabhain et al. | 257/778 |
| 7,791,183 B1 * | 9/2010 | Reid, Jr. | 257/678 |
| 7,897,503 B2 | 3/2011 | Foster et al. | |
| 7,936,062 B2 * | 5/2011 | Humpston et al. | 257/704 |
| 2010/0213600 A1 | 8/2010 | Lau et al. | |

OTHER PUBLICATIONS

Lau, "Evolution, Challenge, and Outlook of TSV (Through-Silicon Via) and 3D IC/Si Integration", Keynote at IEEE Japan ICEP, pp. 16, Apr. 13-15, 2011.

Hueners, "Advances in Bump Technology", Advanced Packaging.

* cited by examiner

*Primary Examiner* — Chris Chu
(74) *Attorney, Agent, or Firm* — Jason K. Klindtworth

(57) ABSTRACT

A microelectronic device structure including increased thermal dissipation capabilities. The structure including a three-dimensional (3D) integrated chip assembly that is flip chip bonded to a substrate. The chip assembly including a device substrate including an active device disposed thereon. A cap layer is physically bonded to the device substrate to at least partially define a hermetic seal about the active device. The microelectronic device structure provides a plurality of heat dissipation paths therethrough to dissipate heat generated therein.

15 Claims, 3 Drawing Sheets

3D INTEGRATED ELECTRONIC DEVICE STRUCTURE INCLUDING INCREASED THERMAL DISSIPATION CAPABILITIES

BACKGROUND

Embodiments presented herein relate to microelectronic device structures and, more particularly, to three-dimensional (3D) microelectronic integrated circuit (IC) chip structures including increased thermal dissipation capability.

Microelectromechanical systems (MEMS) are miniaturized devices, such as microswitches that may range in size from less than 1 micron to about 1 mm or more. 3D integrated circuits in general, include two or more layers of electronic components in a stacked configuration that are integrated both vertically and horizontally. These devices generally require a controlled environment to operate for a long period of time. Dissipation of heat is a major issue in any high-power electronics or electrical application, and extremely important in high-powered microelectromechanical systems or MEMS devices. Through substrate vias, referred to as TSVs, are utilized as conductors in the stack of chips, such as memory chips, providing amongst other functions, a heat path between the chips. Additional means for dissipating heat may be integrated.

Most MEMS devices are interconnected using wirebonding. However, in high power MEMS applications, wirebonding can lead to severe limitations in the performance of the device. Limitations associated with wirebonding are related to the following factors, including, but not limited to, current handling capability of the wires and an insufficient thermal path that may particularly impact handling of short current surges. In other instances, MEMS device may be interconnected using ribbon bonding with similar limitations in the performance of the device.

In addition to performance degradation due to inadequate thermal dissipation, the introduction of contaminants such as moisture, particulates or gas into the environment surrounding the device can cause sticking, contamination, or interference of the metal contacts, leading to device failure.

Accordingly, an improved microelectronic chip structure including increased thermal management, such as improved heat dissipation paths, resulting in a more reliable high-performance device with increased current carrying capabilities may be desired. In addition, it may provide protection from contaminants to an active device.

BRIEF DESCRIPTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with certain embodiments, disclosed is an apparatus including a three-dimensional (3D) integrated chip assembly and a substrate, wherein the three-dimensional (3D) integrated chip assembly is flip chip bonded to a substrate, and wherein a plurality of heat dissipation paths extend through the three-dimensional (3D) integrated chip assembly to dissipate heat generated therein. The chip assembly including a device substrate; an active device comprising one or more heat generating elements disposed on the device substrate; a cap layer physically bonded to the device substrate; and a hermetic seal formed about the active device, the hermetic seal at least partially defined by the device substrate and the cap layer.

In accordance with other embodiments, disclosed is an apparatus including a three-dimensional (3D) integrated chip assembly, a substrate and a heat spreader positioned proximate the three-dimensional (3D) integrated chip assembly via a thermal interface material (TIM). The three-dimensional (3D) integrated chip assembly is flip chip bonded to the substrate. The apparatus provides a plurality of heat dissipation paths through the three-dimensional (3D) integrated chip assembly to dissipate heat generated within the apparatus. The chip assembly including a device substrate; an active device comprising one or more integrated circuits disposed on the device substrate; a cap layer comprising a semiconductor material, the cap layer physically bonded to the device substrate; a hermetic seal formed about the active device, the hermetic seal at least partially defined by the device substrate and the cap layer.

In accordance with further embodiments, disclosed is an apparatus including a MEMS device including a cap layer and a hermetic seal, at least partially defined by the cap layer, and a substrate. The MEMS device is configured to be flip chip bonded to the substrate.

In accordance with further embodiments, disclosed is a method of dissipating heat within an apparatus including providing a three-dimensional (3D) integrated chip assembly. The method of providing the chip assembly including providing a device substrate having a first main surface and a second main surface, disposing an active device comprising one or more integrated circuits on the device substrate, bonding a cap layer to the device substrate, forming a hermetic seal about the active device and providing a substrate including a plurality of input/output connections. The device substrate including a plurality of input/output connections on at least one of the first main surface and the second main surface. The cap layer having a first main surface and a second main surface and including a plurality of input/output connections on at least one of the first main surface and the second main surface. The hermetic seal at least partially defined by the device substrate and the cap layer. The method further provides flip chip bonding the three-dimensional (3D) integrated chip assembly to the substrate to form an apparatus, wherein the apparatus provides a plurality of heat dissipation paths through the three-dimensional (3D) integrated chip assembly to dissipate heat generated within the apparatus.

Various refinements of the features noted above exist in relation to the various aspects of the present invention. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of the present invention without limitation to the claimed subject matter.

DRAWINGS

The terms "top" and "bottom" are not used here because parts of the assembly are processed partly in one orientation, and partly in another. Instead, the terms "first surface" and "second surface" are used, such that all of the first surfaces eventually face the same direction in the finished device structure and all second surfaces eventually face the same direction in the finished device structure.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliant with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Disclosed is an innovative 3D integrated microelectronic chip assembly, and in particular a microelectromechanical systems (MEMS) device including a means for improved thermal management. The 3D integrated device assembly includes integrated layers and parallel connected interconnects to aid in efficient thermal dissipation of heat generated within the device structure and provide increased current carrying capabilities, while lowering electrical resistance in the interconnect structures.

Figure 1:
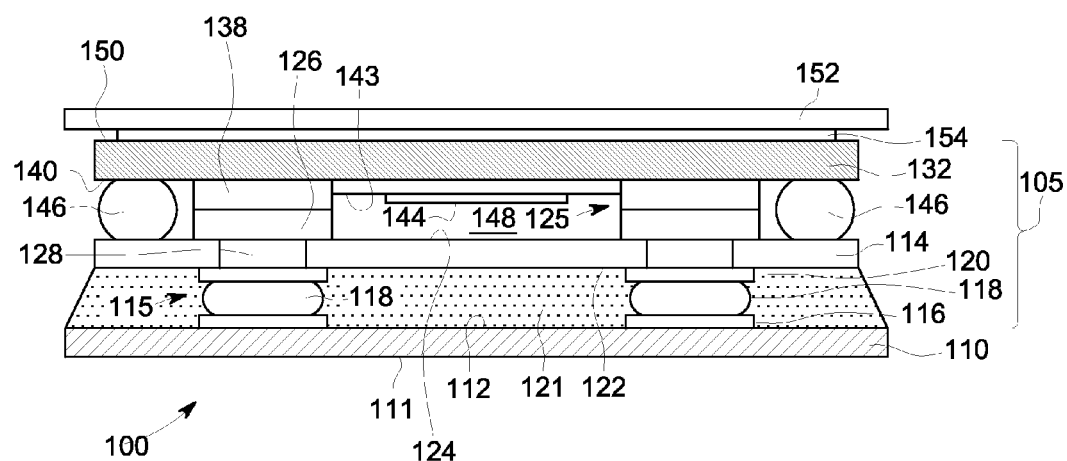
FIG. 1 illustrates in cross-section, a device structure including a three-dimensional integrated electronic assembly having increased thermal dissipation capabilities according to an embodiment.

The drawings show example structures for microelectronic devices, and in particular MEMS devices, including the 3D integrated chip assembly capable of improved thermal dissipation. Referring now to the drawings, in which like numerals refer to like elements throughout the several views, and in particular FIG. 1, illustrated is a cross-sectional embodiment of one example of a device structure employing a 3D integrated chip assembly with increased thermal dissipation capabilities. This device structure, generally denoted 100, includes a 3D integrated chip assembly 105 mounted to a substrate 110 having a first main surface 111 and a second main surface 112. The 3D integrated chip assembly 105 in general comprises a cap layer 114 having a first main surface 122 and a second main surface 124 and a device substrate 132 having a first main surface 140 and a second main surface 150. During fabrication of the device structure 100, the 3D integrated chip assembly 105 is mounted to the second main surface 112 of the substrate 110. In this particular embodiment of the device structure 100, the cap layer 114 is mounted via a first main surface 122 to the substrate 110 utilizing a plurality of micro-bump connections 115, also referred to herein as flip chip bump bonding, that allow for high current carrying capabilities. The device substrate 132 is mounted onto a second main surface 124 of the cap layer 114, via a first main surface 140 of the device substrate 132 via standard metal interconnects (described presently). A heat spreader 152 may be positioned on a second main surface 150 of the device substrate 132 via a thermal interface material (TIM) 154. In combination, the stacked elements, including the substrate 110, the cap layer 114, the device substrate 132, the interconnects between the multiple layers, the thermal interface material 154 and the heat spreader 152 form the device structure 100.

In this particular embodiment, the substrate 110 for electrical interconnection may be a printed circuit board (PCB) well known in the art. However, those skilled in the art will recognize that the substrate material in an alternative embodiment may comprise an active device layer, such as a metal-oxide semiconductor (MOS) based layer, including, silicon, silicon carbide, gallium-arsenide, etc., or when not considered an active layer, may be comprised of any flat supportive material, such as a polished metal, a flexible plastic, polyimide, a semiconductor material, or an insulator such as glass or a quartz material.

In this particular embodiment, the device substrate 132 may be formed of silicon well known in the art. However, those skilled in the art will recognize that the device substrate material in an alternative embodiment may comprise any flat supportive material compatible with semiconductor and MEMS based fabrication and packaging processes, such as silicon, silicon carbide, gallium arsenide, gallium nitride, alumina, sapphire, titanium, steel, plastics, polyimide, glass, quartz etc.

The second main surface 112 of the substrate 110 contains a plurality of input/output contacts 116 which are shown soldered via a plurality of parallel configured solder bumps 118 to a plurality of first input/output contacts 120 disposed on the first main surface 122 of the cap layer 114 and configured to match the input/output contacts 116 of the substrate 110. Standard wafer processes are used to fabricate the substrate 110 layer's plurality of input/output contacts 116, patterned and located to match the input/output contacts of a cap layer 114 (described presently) to which the 3D integrated chip assembly 105, and more particularly the cap layer 114, is to be attached. The plurality of input/output contacts 116 could be constructed as one or more metal layers, e.g., copper, nickel and/or gold layers. The actual composition of the metal layers in the input/output contact stacks would be dependent on the substrate 110 materials. In an embodiment, the device substrate 132 and cap layer 114 are first bonded together to form the 3D integrated chip assembly 105, also referred to herein as a "MEMS" or "device chip", that is then attached via solder bumps 118 to the substrate 110. In a preferred embodiment, many parallel bumps are used to serve as high current carriers as well as thermal shunts. The parallel microbump interconnections can range from 2 to 50 or even more in number per IO depending on the package size, IO count, etc.

An underfill material 121, as is well known in the art, is illustrated as disposed between the substrate 110 and the cap layer 114. The underfill material 121 can be used to fill in the space between the substrate 110 and the cap layer 114 so that the micro-bump connections 115, and more particularly the plurality of input/output connections 116, the plurality of first input/output connections 120 and the solder bumps 118 remain secured. In the event of different coefficients of expansion between the substrate 110 and the cap layer 114, they may expand or contract by different amounts when the device structure 100 is heated or cooled due to the heat generated during operation. This heating or cooling of the device structure 100 may create relative motion between the various device structure 100 layers. The inclusion of the underfill material 121 may aid in preventing the interconnects between the substrate 110 and the cap layer 114 becoming unsecured.

The cap layer 114 is further configured to support on the second main surface 124, a plurality of second input/output contacts 126 configured to match, or otherwise interface to or be compatible with, a plurality of input/output contacts (described presently) formed on the device substrate 132. Interconnects from the lower main surface 122 of the cap layer 114 to the second main surface 124 can be achieved by various means, including constructing a plurality of through substrate vias 128, and more particularly a plurality of through silicon vias (TSVs) 128, constructed using, for example, laser, high rate reactive ion etching, etc., for via formation and standard wafer processes for via metallization.

As shown, the plurality of first input/output contacts 120 electrically connect via the plurality of through wafer vias 130 to the plurality of second input/output contacts 126 disposed on the second main surface 124 of the cap layer 114. The plurality of through wafer vias 130 are electrically isolated from the cap layer 114.

One embodiment of the device 100 described herein includes the fabrication of the cap layer 114 of a semiconductor material, and for example, matching the cap layer 114 material to the substrate 110 to which it is to be connected, when the substrate 110 is not a printed circuit board (PCB). More specifically, one method of fabricating the device structure 100 is to select the cap layer 114 of a semiconductor material to match the material employed by the substrate 110; for example, silicon. This minimizes mechanical stress, strain and otherwise provides a high reliability package and interconnects, and also provides for an electrical interconnect performance equivalent. By way of example, if the device structure 100 includes a silicon substrate 110 then the cap layer 114 may also be fabricated of silicon. Since silicon based integrated circuit devices predominate today, the discussion provided herein may discuss a silicon cap layer 114. However, those skilled in the art will recognize that the device substrate material and the cap layer material could comprise any semiconductor material, including, silicon, silicon carbide, gallium-arsenide, etc. or alternatively a material such as quartz, or the like. Standard wafer processes can be employed to fabricate the cap layer 114, including creating the plurality of first input/output contacts 120 on the cap layer 114 using wafer processing.

After the cap layer 114 material is selected, the plurality of through wafer 130 are created (by, for example, plasma etching, drilling, laser drilling, chemical etching, high rate reactive ion etching, laser ablation, etc., through the cap layer 114), optionally insulated to electrically isolate the cap layer 114 and subsequent electrical interconnections, and then metalized to form electrical connections from the first main surface 122 of the cap layer 114 to the second main surface 124 of the cap layer 114.

Following via creation as previously described, standard wafer processes (photolithography, wet chemistry, physical vapor deposition (PVD), electroplating, etc.) can be employed to create the metalized through wafer vias 130. One embodiment of the through-via construction process is to use wet chemistry (to relieve stress) followed by oxidation to establish an insulative layer partially covering the surface of the cap layer 114 and the walls of the vias (without filling the vias) to provide the necessary electrical isolation from the cap layer 114. Seed metal is then deposited to establish a metal layer in the vias, prior to plating the vias with metal, for example, copper, nickel, gold, etc. A photomask is applied and the circuitry (e.g., input/output) contacts and interconnect to the through vias, if any, is patterned. Once complete, cap layer 114 such as depicted in FIG. 1 is attained, wherein the metalized through vias extend from the first main surface 122 to the second main surface 124 of the cap layer 114.

Following through-via creation, standard wafer processes are used to fabricate the cap layer's 114 plurality of input/output contacts 126, patterned and located to match the input/output contacts of a device substrate 132 to which the cap layer 114 is to be attached, in addition to fabricating the plurality of first input/output contacts 120. On the opposite first main surface 122 of the cap layer 114, for example, the plurality of input/output contacts 120 are formed. The pluralities of input/output contacts 120 and 126 could be constructed as a stack of metal layers, e.g., copper, nickel and/or gold layers. The actual composition of the metal layers in the input/output contact stacks would be dependent on the cap layer 114 material and attachment method used.

In the embodiment of FIG. 1, the plurality of through wafer vias 130 formed within the cap layer 114 are aligned under or in close proximity to the plurality of first input/output contacts 120 to be disposed on the first main surface 122 of the cap layer 114 and the plurality of second input/output contacts 126 to be disposed on the second main surface 124 of the cap layer 114. The plurality of second input/output contacts 126, in one embodiment, are patterned to match a plurality of input/output contacts 138 or pad configuration of the device substrate 132 to which the cap layer 114 is to be attached, while the plurality of second input/output contacts 120 are configured to facilitate connection to the substrate 110 which the cap layer 114 is also to be connected. In one embodiment, the diameters of the through wafer vias 130 are dependent on the quantity of through wafer vias 130 and location of the device substrate 132, plurality of input/output contacts 138 and plurality of input/output contacts 116. For high density input/output configurations, the diameter of each via 130 may be as small as ten microns or less using today's technology.

As shown, the plurality of first input/output contacts 120 disposed on the first main surface 122 of the cap layer 114 electrically connect via metalized vias 130 to the plurality of second input/output contacts 126 disposed on the second main surface 124 of the cap layer 114.

The device substrate 132, as previously described, includes a plurality of input/output contacts 138 formed on the first main surface 140. The plurality of input/output contacts 138 are shown bonded, such as through thermocompression bonding, to the plurality of second input/output contacts 126 disposed on the second main surface 124 of the cap layer 114 and configured to match the input/output contacts 126 of the cap layer 114. It should be understood that although two separate layers are depicted throughout the figures to form the interconnections 125, any number of layers of materials may be utilized. Thermally conductive traces 143 provide for interconnect of an active device to the first main surface 140 of the device substrate 132 and dissipation of heat (described presently). The term "active device" as used herein may comprise any heat generating element, such as a semiconducting integrated circuit (IC), a simple resistor, a sensor such as an acoustic (ultrasound) sensor, an optical (LCD, photodiode, spatial light modulator) device, or any similar type heat generating device. In the illustrated exemplary embodiment, the active device 144 comprises a microelectromechanical system (MEMS) circuit and in particular a micro scale relay.

As illustrated in FIG. 1, a sealing ring 146 provides hermetic sealing of the active device 144. The sealing ring 146 may be comprised of any known sealing material, such as glass frit, eutectic metal compositions, polymer adhesives, thermal compressive metal bonds, or the like. In an embodiment including a glass frit sealing ring 146, during assembly, a glass frit ring, such as a thixotropic paste, may be screen printed onto one of the device substrate 132 or the cap layer 114 and dried. In an example embodiment, the frit thickness is in the 5 to 20 micron range. The printed glass frit ring will eventually form a hermetic seal 148 for the individual active device(s) 144. To form the hermetic seal 148, a wafer bonding process, to melt the glass particles, is performed thereby creating the sealing ring 146 and the hermetic seal 148. Typical wafer processing of the glass frit ring may employ glass reflow and bonding temperatures of approximately 400° C. under vacuum and with an applied wafer-to-wafer force. The reflowed glass frit sealing process will permit the sealing ring 146 to hermetically seal the active device 144 between the second main surface 124 of the cap layer 114 and the first main surface 140 of the device substrate 132. Due to the movement generated by the mechanical components during operation, the active device 144 is susceptible to external air and unwanted particles, such as moisture, dust particles, or the like. The sealing ring 146 and hermetic seal 148 about the active device 144 may provide protection from these unwanted contaminants.

A second main surface 150 of the device substrate 132 may be attached to an optional heat spreader 152, via a thermal interface material (TIM) 154 disposed therebetween. In the illustrated embodiment, heat generated by the active device 144 may be dissipated through the heat spreader 152 into the external environment. The inclusion of the heat spreader 152 and the TIM 154 may be dependent upon the need for additional heat dissipation capabilities within the structure 100.

The cap layer 114, hermetic sealing of the active device 144, plurality of parallel interconnects and overall device structure 100 constructed as discussed above may alleviate some or all of the problems associated with heat dissipation in high powered microelectronic chip structures, and more particularly high powered microelectromechanical systems (MEMS). In addition, the 3D integrated chip assembly 105 constructed as described herein, can be easily picked and placed with a high-accuracy, high volume placement machine and assembled onto the substrate 110 for packaging.

Figure 2:
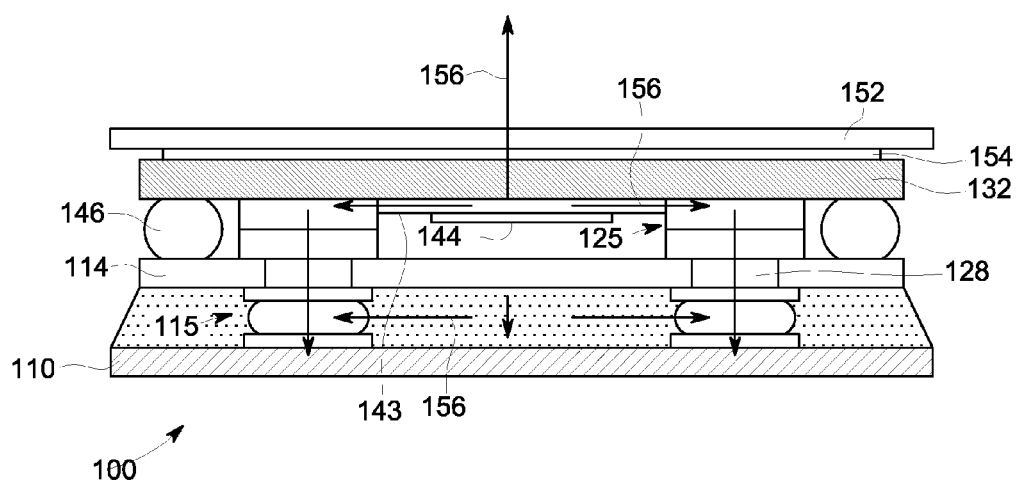
FIG. 2 illustrates in cross-section, the device structure of FIG. 1 indicating heat dissipation paths according to an embodiment.

Referring now to FIG. 2, illustrated is the device structure 100, constructed according to the previous description, depicting a plurality of heat dissipation paths 156 according to an embodiment. As previously stated, like numerals refer to like elements throughout the several views. During transient current conditions, the plurality of heat dissipation paths 156, as illustrated, are available. The heat dissipation paths 156 as disclosed herein place the heat generation in direct connection with dissipation over the power lines compared to heat spreaders which require heat to first flow through the bulk substrate, then through the TIM and then to the heat spreader. As illustrated, during operation, heat generated by the device structure 100, and more particularly the active device 144, is dissipated via the plurality of heat dissipation paths 156, and in particular along thermally conductive traces 143 on the wafer or cap surface that take heat from the device 144 to the interconnect structure 125 and down the solder bump flip chip assembly 115. The heat dissipation paths 156 provide a continuous thermally conductive metal pathway from the active device 144 to its metal interconnections, thus serving as the primary path for heat dissipation. The flip chip interconnects 115 provide many thermal dissipation paths 156 through each electrical joint that are better thermally coupled to the heat generation source, and more particularly the active device 144, than solely relying on heat dissipation through bulk silicon, or the like. In addition to providing for many parallel shorter electrical paths 156, the flip chip interconnects 115 provide for shorter dissipation paths 156. As depicted, heat may be dissipated by the microbump interconnects 115 formed by the flip chip joints located between the substrate 110 and the cap layer 114, and the metal interconnections 125 formed between the cap layer 114 and the device substrate 132. Any additional heat may be dissipated through the heat spreader 152, when included in the device structure 100. The described novel flip chip approach provides for a shorter interconnect path length, thereby making it more favorable to dissipate heat. Such short and highly parallelized thermal paths serve a significant advantage over other interconnection methods such as wire-bonds and ribbon bonding.

Figure 3:
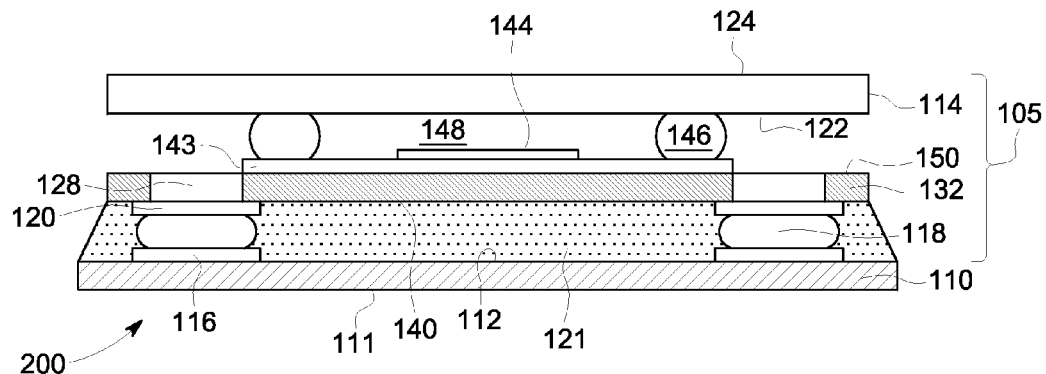
FIG. 3 illustrates in cross-section, a device structure including a three-dimensional integrated electronic assembly having increased thermal dissipation capabilities according to another embodiment.
Figure 4:
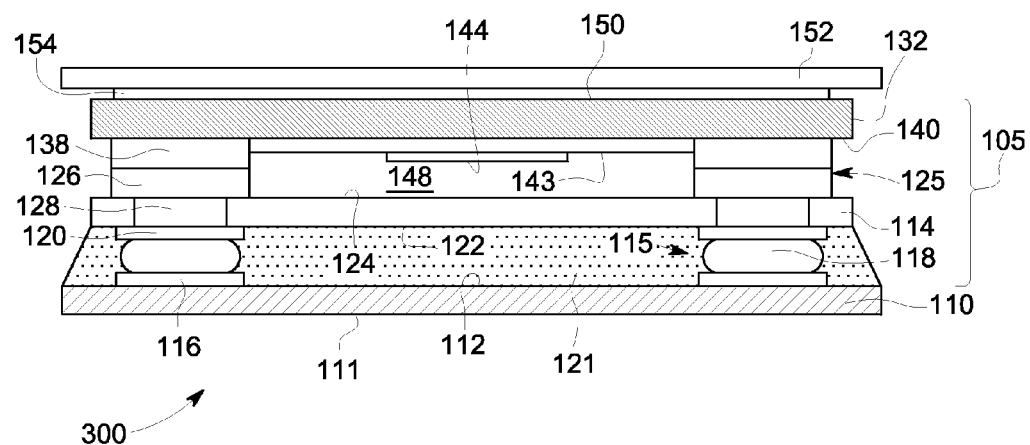
FIG. 4 illustrates in cross-section, a device structure including a three-dimensional integrated electronic assembly having increased thermal dissipation capabilities according to yet another embodiment.

Further examples of device structure configurations employing higher power heat dissipation capabilities are depicted in FIGS. 3 and 4, in which like numerals again refer to like elements throughout the several views. Referring more specifically to FIG. 3, illustrated is another embodiment of a device structure 200 including a substrate 110, and a 3D integrated chip assembly 105 generally comprising a cap layer 114 and a device substrate 132. In this particular embodiment, and in contrast to the embodiment depicted in FIGS. 1 and 2, the device substrate 132 is disposed in a lower portion of the 3D integrated chip assembly 105 and more particularly, the cap layer 114 is disposed on a first main surface 150 of the device substrate 132. In addition, the active device 144 is positioned via thermally conductive traces 143 on the second main surface 150 of the device substrate 132. The device substrate 132 further includes a plurality of through wafer vias 128 formed therein and a plurality of first input/output contacts 120 disposed over a first main surface 140 thereof, wherein the plurality of second input/output contacts 120 are electrically connected to the active device 144 through the plurality of through wafer vias 130. Similarly configured flip chip bump interconnects to those of the first embodiment illustrated in FIGS. 1 and 2 are formed between a second main surface 112 of the substrate 110 and the first main surface 140 of the device substrate 132. An underfill material 121 may be provided. The sealing ring 146 forms a hermetic seal 148 for the active device 144 between the device substrate 132 and the cap layer 114. In addition, the sealing ring 146 provides a physical bond between the second main surface 150 of the device substrate 132 and the first main surface 122 of the cap layer 114. In this particular embodiment, and in contrast to the embodiment depicted in FIGS. 1 and 2, the heat spreader 152 and the thermal interface material 154 have been omitted. Similar to the first disclosed embodiment, heat generated by the device structure 200, and more particularly the active device 144, is dissipated in a similar manner according to heat dissipation paths illustrated in FIG. 2. It should additionally be understood that irrespective of the configuration of the cap layer 114 and the device substrate 132 within the 3D integrated chip assembly 105, the inclusion of the thermal interface material 154 and the heat spreader 152 remain dependent upon the need for additional heat dissipation capabilities.

Referring now to FIG. 4, illustrated is yet another embodiment of a device structure 300 including a substrate 110 and a 3D integrated chip assembly 105 generally comprising a cap layer 114 and a device substrate 132, configured in a stack generally similar to the embodiment described in FIGS. 1 and 2. In this particular embodiment, and in contrast to the embodiment depicted in FIGS. 1 and 2, the heat spreader 152 and the thermal interface material 154 have been omitted. An optional heat spreader 152 is positioned on the first main surface 124 of the cap layer 114 via a thermal interface material (TIM) 154. In this particular embodiment, the sealing ring is omitted, and a hermetic seal 148 for the active device 144 is formed by the device substrate 132, the cap layer 114, and the metal interconnects 125 formed between the cap layer 114 and the device substrate 132. More specifically, the plurality of second input/output contacts 126 formed on the second main surface 124 of the cap layer 114 and the plurality of input/output contacts 138 formed on the first main surface 140 of the device substrate 132, provide for the hermetic seal 148 about the active device 144. In yet, another alternate embodiment, an additional interconnect-via structure can be included about the active device 144, comprising a set of metal interconnects 125 formed between the cap layer 114 and the device substrate 132, vias 130, and interconnects 116, 120 and bumps 118 formed between the cap layer 114 and the substrate 110 may be included to form an additional seal.

Similar to the previously disclosed embodiments, heat generated by the device structure 300, and more particularly the active device 144, is dissipated in a similar manner according to heat dissipation paths illustrated in FIG. 2. It should be understood that while FIG. 4 includes the 3D integrated chip assembly 105 configured wherein the cap layer 114 is positioned to allow for attachment to the substrate 110, in an alternative embodiment, the cap layer 114 and device substrate 132 may be reversed with respect to configuration in the 3D integrated chip assembly 105, such as described and illustrated in FIG. 3, to allow for attachment of the device substrate 132 to the substrate 110. It should additionally be understood that irrespective of the configuration of the cap layer 114 and the device substrate 132 within the 3D integrated chip assembly 105, the inclusion of the thermal interface material 154 and the heat spreader 152 remain dependent upon the need for additional heat dissipation capabilities.

Figure 5:
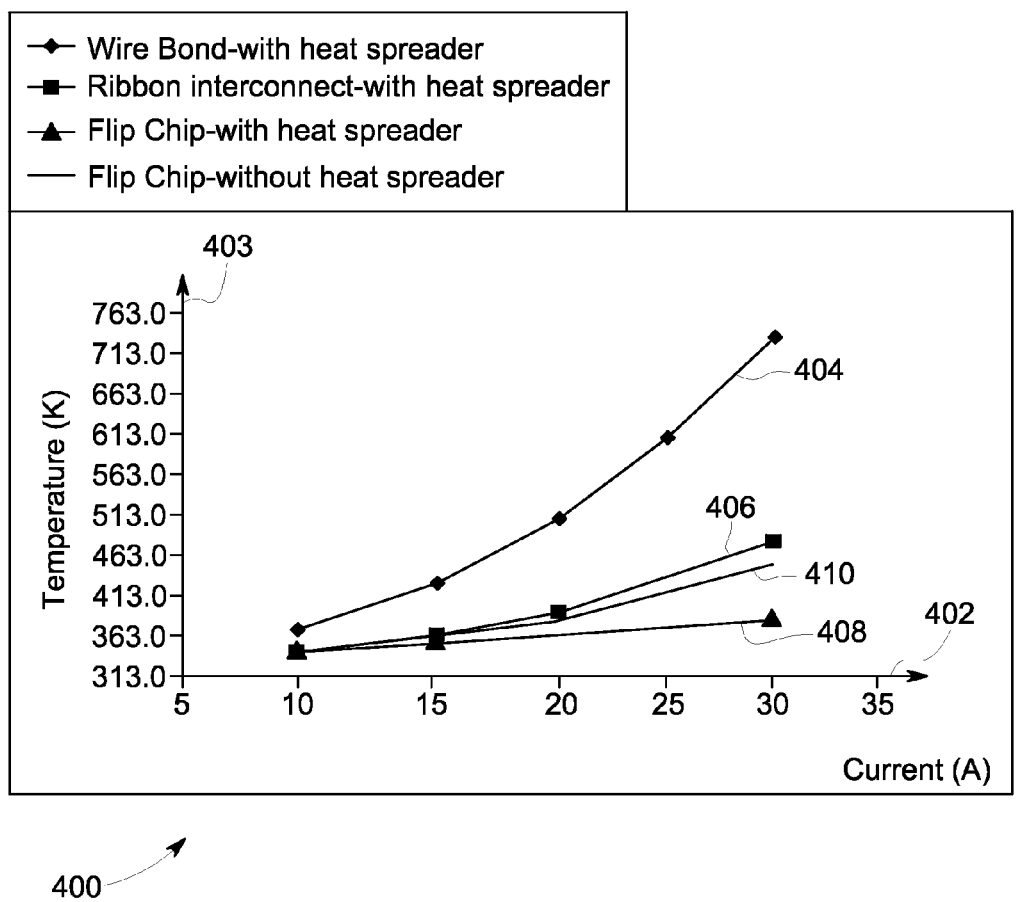
FIG. 5 illustrates in graphical representation, a comparison of thermal dissipation at transient current rise conditions in a device structure according to an embodiment.

Illustrated in FIG. 5, are simulation results 400 depicting heat dissipation of embodiments of a high powered microelectronic device structure including known interconnect/stack configurations and the novel interconnect/stack configurations described herein. More specifically, heat dissipation is graphically represented in FIG. 5 to illustrate the improved heat dissipation qualities of a flip chip board configuration. Current (A) is represented on an x-axis 402 the maximum temperature in the package (typically at the MEMS beams) and temperature (K) is represented on a y-axis 403. Typical heat dissipation in a known microelectronic device structure, including standard wire bond/trace interconnects and a heat spreader is depicted at line 404. As indicated, at a current of approximately 30 Amps, wire bond/trace interconnects limit the thermal conductivity of the packaged device causing the temperature to get excessively hot, and as illustrated in excess of 700 K.

Typical heat dissipation of a known microelectronic device structure including copper strap interconnects and a heat spreader is depicted at line 406. As indicated, at a current of approximately 30 Amps the heat in a known device including copper strap interconnects, while capable of dissipating heat more efficiently than in the previous device including wire bond/trace interconnects, is only capable of dissipating heat wherein the device remains at a temperature in excess of 460 K.

Typical heat dissipation of a microelectronic device structures configured to include a cap layer, hermetic seal and interconnects as in the previously described embodiments of FIG. 1-4 are depicted at lines 408 and 410. As indicated at line 408, at a current of approximately 30 Amps the heat in a novel device including a cap layer, hermetic seal, novel flip chip interconnects and a heat spreader, such as that described in FIGS. 1-4 is capable of dissipating heat more efficiently than in previous known devices including wire bond/trace interconnects or ribbon-based interconnects. As depicted at line 408, the temperature is efficiently dissipated and the temperature of the device at approximately 30 Amps is less than 400 K.

Typical heat dissipation of a microelectronic device structure configured to include a cap layer, hermetic seal and interconnects as in the previously described embodiment of FIG. 4, wherein a heat spreader is not incorporated in the device structure is depicted at line 410. As indicated at line 410, at a current of approximately 30 Amps the heat in a novel device including a cap layer and novel flip chip interconnects, but without the inclusion of a heat spreader, while dissipating less heat than the flip chip embodiment incorporating the heat spreader at line 408, remains capable of dissipating heat more efficiently than in previous known devices including wire bond/trace interconnects or copper strap interconnects wherein a heat spreader was utilized. As depicted at line 410, the temperature in this embodiment is efficiently dissipated and the temperature of the device at approximately 30 Amps is less than 450 K.

Those skilled in the art will understand from the above examples, that provided herein is a novel interconnect structure and device structure stack or package which can be employed to improve heat dissipation in high power microelectronic devices, such as microelectromechanical systems (MEMS) devices. By fabricating the device to include a 3D integrated chip assembly comprising a cap layer, a device substrate, a plurality of metal interconnects and an active device, a plurality of bump interconnects between the 3D integrated chip assembly and an underlying substrate and a hermetic seal about the active device and between the cap layer and the device substrate, a low cost, high performance, high yield device structure can be obtained using standard chemistry, mechanical processes, etc. Further, the device structure and techniques disclosed herein may result in advantages including, but not limited to, increased thermal management by way of increased heat dissipation capabilities, easier package integration and lower electrical resistance interconnects. Mechanical and thermal management systems for rather thin, fragile integrated circuit chips and devices are also provided.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:
1. An apparatus comprising:
 a three-dimensional (3D) integrated chip assembly, the chip assembly comprising:
  a device substrate;
  a MEMS relay comprising one or more heat generating elements disposed on the device substrate;
  a cap layer physically bonded to the device substrate; and
  a sealing ring disposed about the MEMS relay;
  a hermetic seal formed about the MEMS relay, the hermetic seal at least partially defined by the device substrate, the cap layer and the sealing ring and wherein the sealing ring is not in electrical communication with the MEMS relay and the device substrate; and a substrate, wherein the three-dimensional (3D) integrated chip assembly is flip chip bonded to the substrate, a plurality of electrically and thermally conductive paths having a lower thermal resistance than the MEMs relay, wherein the plurality of electrically and thermally conductive paths extend through the three-dimensional (3D) integrated chip assembly to dissipate heat generated therein and provide electrical connections to the MEMS relay.

2. The apparatus as claimed in claim 1, further comprising a heat spreader positioned proximate the three-dimensional (3D) integrated chip assembly via a thermal interface material (TIM) for facilitating dissipation of heat from the apparatus.

3. The apparatus as claimed in claim 1, wherein the cap layer further comprises a plurality of through wafer vias formed therein and a plurality of first input/output contacts disposed over a first main surface thereof and plurality of second input/output contacts disposed over a second main surface thereof, wherein the plurality of second input/output contacts are electrically connected to the plurality of first input/output contacts through the plurality of through wafer vias.

4. The apparatus as claimed in claim 3, wherein the plurality of first input/output contacts disposed over the first main surface of the cap layer facilitate coupling to a plurality of input/output pads of the substrate to which the cap layer is to be attached, and
wherein the plurality of second input/output contacts disposed over the second main surface of the cap layer facilitate coupling to a plurality of input/output contacts of the device substrate to which the cap layer is also to be attached.

5. The apparatus as claimed in claim 1, wherein the device substrate further comprises a plurality of through wafer vias formed therein and a plurality of first input/output contacts disposed over a first main surface thereof, wherein the plurality of first input/output contacts are electrically connected to the MEMS relay through the plurality of through wafer vias.

6. The apparatus as claimed in claim 5, wherein the plurality of first input/output contacts disposed over the first main surface of the device substrate facilitate coupling to a plurality of input/output pads of a substrate to which the device substrate is to be attached, and
wherein the plurality of thermally conductive traces disposed over the second main surface of the device substrate facilitate coupling of the MEMS relay to the device substrate.

7. An apparatus comprising:
a three-dimensional (3D) integrated chip assembly, the chip assembly comprising;
a device substrate including a MEMS relay comprising one or more integrated circuits disposed on the device substrate;
a cap layer comprising a semiconductor material, the cap layer physically bonded to the device substrate;
a sealing ring disposed about the MEMS relay;
a hermetic seal formed about the MEMS relay, the hermetic seal at least partially defined by the device substrate, and the cap layer and the sealing ring and wherein the sealing ring is not in electrical communication with the MEMS relay and the device substrate;

a substrate, wherein the three-dimensional (3D) integrated chip assembly is flip chip bonded to the substrate; and
a heat spreader positioned proximate the three-dimensional (3D) integrated chip assembly via a thermal interface material (TIM),
a plurality of electrically and thermally conductive paths having a lower thermal resistance than the MEMs relay, wherein the plurality of electrically and thermally conductive paths extend through the three-dimensional (3D) integrated chip assembly to dissipate heat generated within the apparatus and provide electrical connections to the MEMS relay.

8. The apparatus as claimed in claim 7, wherein the cap layer further comprises a plurality of through wafer vias formed therein and a plurality of first input/output contacts disposed over a first main surface thereof and plurality of second input/output contacts disposed over a second main surface thereof, wherein the plurality of second input/output contacts are electrically connected to the plurality of first input/output contacts through the plurality of through wafer vias, and
wherein the plurality of first input/output contacts disposed over the first main surface of the cap layer facilitate coupling to a plurality of input/output pads of the substrate to which the cap layer is to be attached, and
wherein the plurality of second input/output contacts disposed over the second main surface of the cap layer facilitate coupling to a plurality of input/output contacts of the device substrate to which the cap layer is also to be attached.

9. The apparatus as claimed in claim 7, wherein the device substrate further comprises a plurality of through wafer vias formed therein and a plurality of first input/output contacts disposed over a first main surface thereof, wherein the plurality of first input/output contacts are electrically connected to the MEMS relay through the plurality of through wafer vias and a plurality of thermally conductive traces, and wherein the plurality of first input/output contacts disposed over the first main surface of the device substrate facilitate coupling to a plurality of input/output pads of the substrate to which the device substrate is to be attached.

10. The apparatus of claim 7, wherein the substrate is one of a printed circuit board (PCB) or a flexible substrate.

11. The apparatus of claim 7, wherein the substrate is comprised of a semiconductor material and the cap layer is comprised of a semiconductor material that matches at least in part the semiconductor material of the substrate.

12. The apparatus of claim 7, wherein the device substrate is an active device layer.

13. An apparatus comprising:
a MEMS relay device including a cap layer, a device substrate, a sealing ring and a hermetic seal formed about the MEMS relay device and at least partially defined by the cap layer, the device substrate and the sealing and wherein the sealing ring is not in electrical communication with the MEMS relay device and the device substrate; and
a substrate,
wherein the MEMS relay device is configured to be flip chip bonded to the substrate.

14. The apparatus as claimed in claim 13, wherein the cap layer further comprises a plurality of through wafer vias formed therein and a plurality of first input/output contacts disposed over a first main surface thereof and plurality of second input/output contacts disposed over a second main surface thereof, wherein the plurality of second input/output contacts are electrically connected to the plurality of first input/output contacts through the plurality of through wafer vias, and wherein the plurality of first input/output contacts disposed over the first main surface of the cap layer facilitate coupling to a plurality of input/output pads of the substrate to which the cap layer is to be attached, and wherein the plurality of second input/output contacts disposed over the second main surface of the cap layer facilitate coupling to a plurality of input/output contacts of the device substrate to which the cap layer is also to be attached.

15. The apparatus as claimed in claim 13, wherein the device substrate further comprises a plurality of through wafer vias formed therein and a plurality of first input/output contacts disposed over a first main surface thereof, wherein the plurality of first input/output contacts are electrically connected to the MEMS relay device through the plurality of through wafer vias and a plurality of thermally conductive trace, and wherein the plurality of first input/output contacts disposed over the first main surface of the device substrate facilitate coupling to a plurality of input/output pads of the substrate to which the device substrate is to be attached.

\* \* \* \* \*

UNITED STATES PATENT AND TRADEMARK OFFICE
CERTIFICATE OF CORRECTION

Page 1 of 2

PATENT NO. : 8,698,258 B2
APPLICATION NO. : 13/249492
DATED : April 15, 2014
INVENTOR(S) : Nagarkar et al.

It is certified that error appears in the above-identified patent and that said Letters Patent is hereby corrected as shown below:

Title Page, Item (75), under "Inventors", in Column 1, Line 3, delete "Schnectady," and insert -- Schenectady, --, therefor.

In the Specification

In Column 5, Line 20, delete "130" and insert -- 128 --, therefor.

In Column 5, Line 22, delete "130" and insert -- 128 --, therefor.

In Column 5, Line 49, delete "wafer 130" and insert -- wafer vias 128 --, therefor.

In Column 5, Line 60, delete "130." and insert -- 128. --, therefor.

In Column 6, Line 21, delete "130" and insert -- 128 --, therefor.

In Column 6, Line 30, delete "second input/output contacts 120" and insert -- first input/output contacts 120 --, therefor.

In Column 6, Line 33, delete "130" and insert -- 128 --, therefor.

In Column 6, Line 34, delete "130" and insert -- 128 --, therefor.

In Column 6, Line 37, delete "130" and insert -- 128 --, therefor.

In Column 6, Line 41, delete "130" and insert -- 128 --, therefor.

In Column 8, Lines 33-34, delete "second input/output contacts 120" and insert -- second input/output contacts 126 --, therefor.

Signed and Sealed this
Twenty-fourth Day of March, 2015

Michelle K. Lee
*Director of the United States Patent and Trademark Office*

CERTIFICATE OF CORRECTION (continued)
U.S. Pat. No. 8,698,258 B2

In Column 8, Line 35, delete "130." and insert -- 128. --, therefor.

In Column 9, Line 14, delete "130," and insert -- 128, --, therefor.

In the Claims

In Column 11, Line 7, in Claim 1, delete "MEMs" and insert -- MEMS --, therefor.

In Column 11, Line 64, in Claim 7, delete "and the" and insert -- the --, therefor.

In Column 12, Line 7, in Claim 7, delete "MEMs" and insert -- MEMS --, therefor.

In Column 12, Line 55, in Claim 13, delete "sealing and" and insert -- sealing ring and --, therefor.